United States Patent
Cote et al.

(10) Patent No.: US 7,621,043 B2
(45) Date of Patent: Nov. 24, 2009

(54) DEVICE FOR MAKING AN IN-MOLD CIRCUIT

(75) Inventors: Andre Cote, Williamstown, NJ (US); Detlef Duschek, Sensbachtal (DE)

(73) Assignee: Checkpoint Systems, Inc., Thorofare, NJ (US)

( * ) Notice: Subject to any disclaimer, the term of this patent is extended or adjusted under 35 U.S.C. 154(b) by 68 days.

(21) Appl. No.: 11/554,237

(22) Filed: Oct. 30, 2006

(65) Prior Publication Data

US 2007/0098942 A1   May 3, 2007

Related U.S. Application Data

(60) Provisional application No. 60/744,461, filed on Apr. 7, 2006, provisional application No. 60/732,898, filed on Nov. 2, 2005.

(51) Int. Cl.
  *H05K 3/07* (2006.01)
(52) U.S. Cl. .............................. 29/846; 29/848; 29/849
(58) Field of Classification Search ................... 29/846, 29/848, 849
  See application file for complete search history.

(56) References Cited

U.S. PATENT DOCUMENTS

| | | | | |
|---|---|---|---|---|
| 2,757,443 A | * | 8/1956 | Oshry et al. ................... | 29/848 |
| 2,955,351 A | * | 10/1960 | McCreadie ................... | 29/848 |
| 3,990,142 A | * | 11/1976 | Weglin ......................... | 29/848 |
| 5,708,419 A | | 1/1998 | Isaacson et al. | |
| 5,761,801 A | * | 6/1998 | Gebhardt et al. .............. | 29/846 |
| 6,308,406 B1 | * | 10/2001 | Gill et al. ...................... | 29/849 |
| 7,152,317 B2 | * | 12/2006 | Shapira ......................... | 29/846 |
| 2002/0152604 A1 | | 10/2002 | Debraal | |
| 2005/0093172 A1 | | 5/2005 | Tsukahara et al. | |
| 2007/0102486 A1 | | 5/2007 | Cote et al. | |

OTHER PUBLICATIONS

International Search Report, PCT/US2006/060442, dated Jan. 30, 2008.

* cited by examiner

*Primary Examiner*—C. J. Arbes
(74) *Attorney, Agent, or Firm*—Caesar, Rivise, Bernstein, Cohen & Pokotilow, Ltd.

(57) ABSTRACT

A poly sheet continuously moving in a machine direction is heated to a temperature just below its glass thermal temperature to make the poly malleable. A circuit (e.g., RFID chip, EAS chip, transponder, IC) is placed on the poly sheet and embedded into the poly sheet, preferably with a heat resistant soft (e.g., rubber) roller that presses the circuit into the poly without breaking the circuit. A conductive strip or wire may be applied on or into the poly sheet to align with connection points (e.g., conductive bumps) of the circuit for conductive communication with the circuit. The conductive strip or wire is preferably cut to form gaps that are nonconductive between the cut sections of wire to avoid shorting of the circuit and/or allow the conductive strip or wire to function as an antenna for the circuit, and thus to form a chip strap or tag. The poly sheet thus provides a protective womb or shield for the circuit and wire.

19 Claims, 3 Drawing Sheets

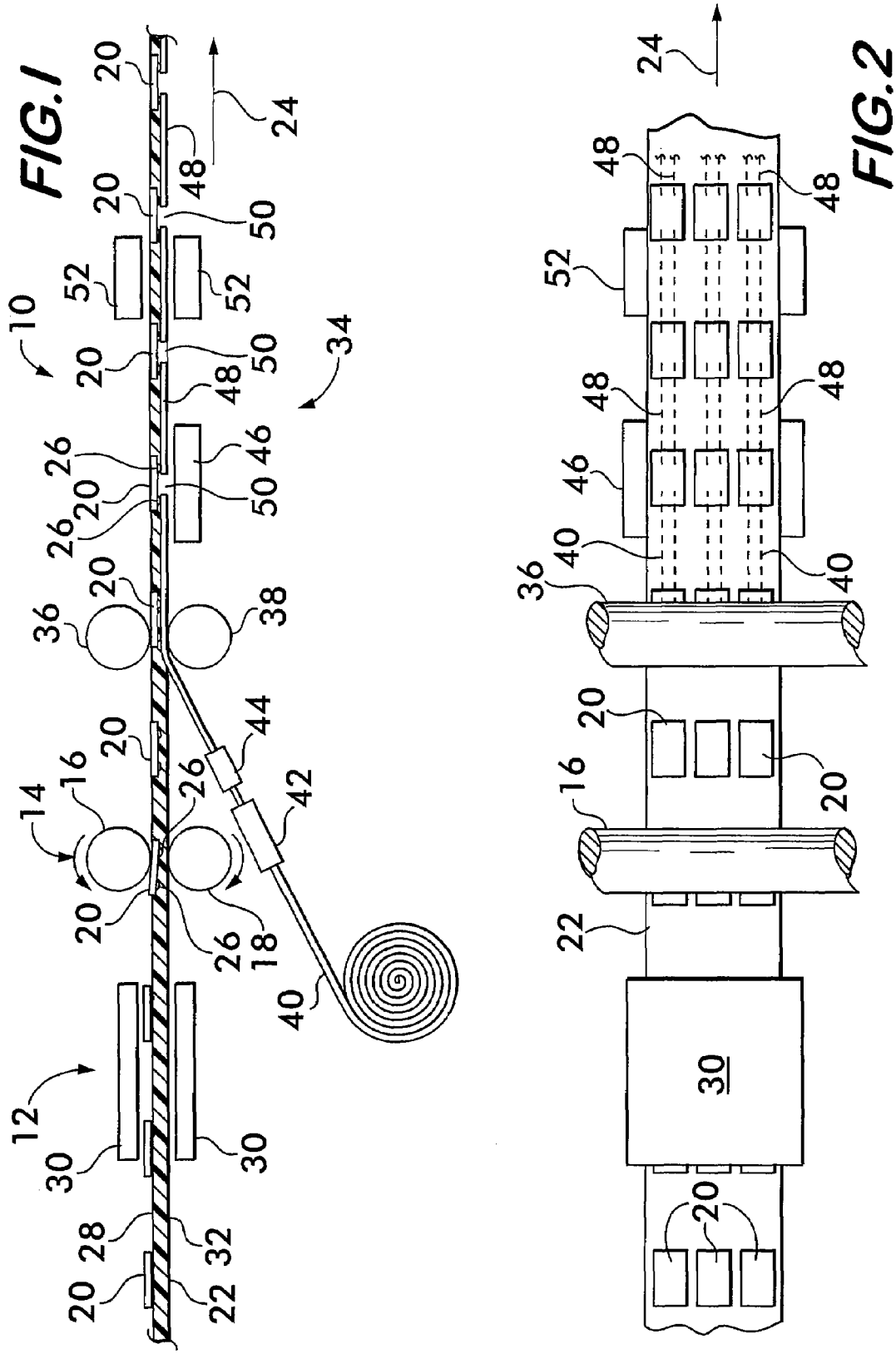

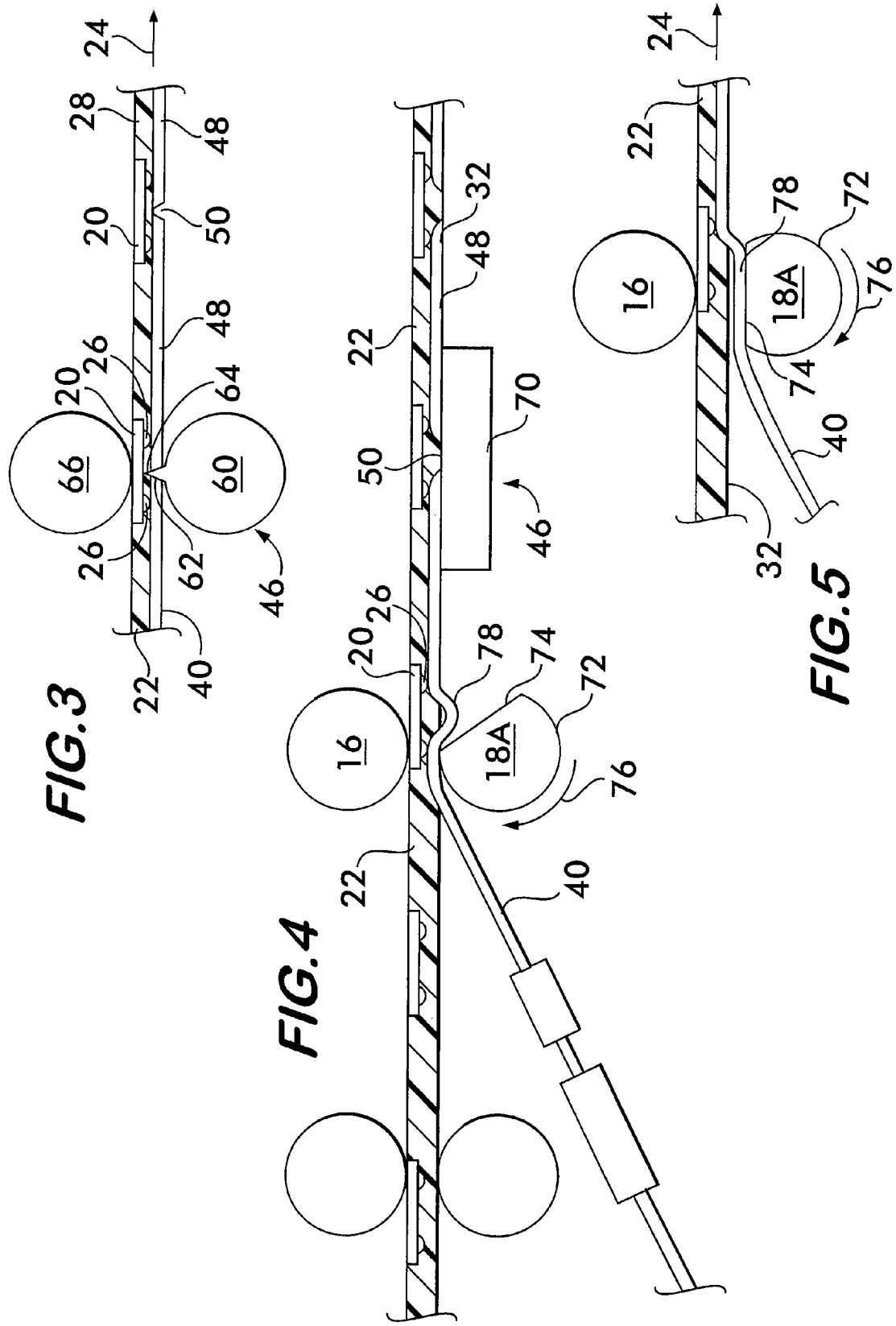

DEVICE FOR MAKING AN IN-MOLD CIRCUIT

CROSS-REFERENCE TO RELATED APPLICATIONS

This utility application claims the benefit under 35 U.S.C. §119(e) of Provisional Application Ser. No. 60/732,898 filed on Nov. 2, 2005 and Provisional Application Ser. No. 60/744, 461 filed Apr. 7, 2006, both entitled IN-MOLD CHIP ATTACH and whose entire disclosures are incorporated by reference herein.

BACKGROUND OF THE INVENTION

1. Field of Invention

This invention is related to communication devices, and in particular, to the manufacture of security tags often use, for example, as Radio Frequency Identification (RFID) circuits.

2. Description of Related Art

Chip bonding is costly. The two largest components of the cost of RFID tags today are the integrated circuit and the attachment of that circuit (otherwise known as silicon) to an antenna structure. While the increasing volume of the number of chips helps to drive the IC cost down, bonding is a mechanical process and does not benefit from the same technology advances or economic scale.

Current methods of chip bonding do not adequately address costs. A two-step approach of an intermediary chip strap achieves incremental costs improvement by relocating the costs. However, straps do not address the problem directly, as bonding is still required, but to a smaller tag. Moreover, straps add another step to bond the strap to the antenna structure. Current manufacturers, using standard bonding technology with straps, want straps to be like traditional bonding surfaces, as commonly found on circuit board technology that is, hard and inflexible. However, such straps do not lend themselves to easy integration into flexible tags (e.g., RFID tags). The standard bonding processes are all known strap-based solutions, and therefore less than ideal.

One related art attachment method, called Fluidic Self Assembly (FSA), provides insufficiently robust bonds. Because the chips find their own way into bonding sockets, the chips cannot use adhesives or flux, since anything sticky prevents free motion of the chips into the sockets. With the fluid self assembly process, the bond is made at a tangent between the chip bonding pad and sides of the bonding cavity. This flat-to-edge bond is different than and less reliable than traditional bonds, which are made flat-to-flat. Fluidic self assembly also places restrictions on the type of substrate that can be used. Fluidic Self Assembly (FSA) does not create the bond, it only places tags into appropriate carrier for attachment. Current FSA method being practiced uses patterned cut out polyester and laminates another film on top of the web with chips in place. The back web then is laser cut leaving a hole in direct proximity and above the chip bonding pad area. This hole is filled with conductive ink and a trace is completed on the back side perpendicular to the hole creating a strap. The FSA process is slow and uses multiple steps and requires a high degree of accuracy with known technology products available today.

A known wire bonding process is disclosed in U.S. Pat. No. 5,708,419 to Isaacson, et al., the contents of which are incorporated by reference herein in its entirety. Isaacson discusses the bonding of an Integrated Circuit (IC) to a flexible or non-rigid substrate which generally can not be subjected to high temperatures, such as the temperature required for performing soldering processes. In this wire bonding process, a chip or dye is attached to a substrate or carrier with conductive wires. The chip is attached to the substrate with the chip front-side face up. Conductive wires are bonded first to the chip, then looped and bound to the substrate. The steps of a typical wire bonding process include:
1. advancing web to the next bond site;
2. stopping;
3. taking a digital photograph of the bond site;
4. computing bond location;
5. picking up a chip;
6. moving the chip to the bond site;
7. using photo feedback to adjust placement to the actual site location;
8. placing or depositing chip;
9. photographing the chip to locate the bond pads;
10. moving the head to the chip bond pad;
11. pressing down, vibrating and welding conductive wire to the bond pad;
12. pulling up and moving the chip to the substrate bond pad, trailing wire back to the chip bond
13. pressing down and welding that bond;
14. pulling up and cutting off the wire; and
15. repeating steps 10-14 for each connection.

In contrast, the interconnection between the chip and substrate in flip-chip packaging is made through conductive bumps of solder that are placed directly on the chip's surface. The bumped chip is then flipped over and placed face down, with the bumps electrically connecting to the substrate.

Flip chip bonding, a current state of the art process, is expensive because of the need to match each chip to a tiny, precision-cut bonding site. As chips get smaller, it becomes even harder to precisely cut and prepare the bonding site. However, the flip-chip bonding process is a considerable advancement over wire bonding. The steps of a typical flip-chip bonding process include:
1. advancing web to the next bond site;
2. stopping;
3. photographing the bond site;
4. computing the bond location;
5. picking up the chip;
6. moving the chip to the bond site;
7. using photo feedback to adjust placement at the actual site location;
8. placing the chip;
9. ultrasonically vibrating the placement head to weld chip in place; and
10. retracting the placement head.

Steps 1 through 8 of each of the above bonding processes are substantially the same. The web must stop to locate the conductive gap in the substrate and precisely place the IC. The related art processes require that the web is stopped and measured (e.g., photographing the bond site, containing the bond location, using photo feedback to adjust placement at the actual site location) so that the chip can be accurately placed as desired adjacent the gap and bonded.

Retracing a path during the bonding process takes time, causes vibration, and wears mechanical linkages. These linkages also create uncertainty in absolute position. Rotating or continuous devices are preferred over reciprocating devices, in part because stopping and starting the manufacturing line always slows things down and reduces throughput. It would be beneficial to adjust tooling to operate in a process that is continuously advancing down the line at a known rate of travel.

A problem exists with the current technology during chip placement onto a dipole. Chips placed down on an antenna structure, such as an aluminum strap to form a bridge or RFID circuit, are easily cracked causing chip failure. A current solution is to use a nonconductive paste adhesive or flux to fill in the cracks made during chip placement that helps to protect the cracked chips from further damage. However, this solution does not cure the problem of chips cracking in the first place. It would be beneficial to provide a solution that prevents the cracking of chips during chip placement. All references cited herein are incorporated herein by reference in their entireties.

BRIEF SUMMARY OF THE INVENTION

The preferred embodiments include an approach for the placement and embedding of integrated circuits (ICs). The preferred approach uses a continuous stream of ICs (e.g., chips) placed onto a flexible poly-based film, sheet or layer (hereinafter referred to as "poly sheet") while the poly sheet is heated to a temperature less than or close to its glass thermal temperature, which is the temperature that melts the poly sheet. In this state, the poly sheet remains stable, yet allows for a chip to be embedded into the poly sheet in precise increments. The chips may also be heated so they can be more easily bumped into the poly sheet. The poly sheet holds the embedded chip in place and a wire (or more if needed) is added during the manufacturing process to form a connection to the chip. The wire can be embedded into the poly sheet opposite the chips to form the connection if the conductive areas (e.g., connection points, conductive bumps) of the embedded chips are not exposed. Of course, the products made under this approach (e.g., chip straps, embedded chips) can be reheated and molded to other plastics.

According to an example of the preferred embodiments, the invention includes a manufacturing device for making an in-mold circuit. The manufacturing device includes a heater and a pressing station. The heater heats a continuously moving sheet of poly (e.g., polyester, polyurethane, polystyrene, etc.) along a machine direction until the poly sheet reaches a malleable condition. The pressing station is adjacent the heating station and embeds chips place onto the poly sheet into the heated poly sheet as the chips and poly sheet continuously move in the machine direction. The preferred manufacturing device may also include a strip applicator adjacent the pressing station that embeds a conductive strip into the poly sheet adjacent the chips and into conductive communication with conductive areas of the chips as the conductive strip and poly sheet continuously move along the machine direction to form an embedded conductive strip. The strip applicator may include a splitting station that separate the conductor strip into portions of the conductive strip with nonconductive gaps between consecutive portions, and with respective consecutive portions of the conductive strip conductively communicatable with respective chips embedded by the pressing station that bridge the respective nonconductive gap between the consecutive portions.

Another example of the preferred embodiments of the invention includes a method or means for making an in-mold circuit. The method includes continuously moving a poly sheet along a machine direction, heating the continuously moving poly sheet into a malleable condition, and embedding chips into the heated poly sheet as the chips and poly sheet continuously move in the machine direction. The method for making an in-mold circuit may also include embedding a conductive strip into the poly sheet and into conductive communication with the embedded chips as the conductive strip and poly sheet continuously move to form an embedded conductive strip. Moreover, the method may also include separating the embedded conductive strip along the machine direction into portions of the conductive strip and forming nonconductive gaps between consecutive portions of the conductive strip with the consecutive portions conductively communicatable with respective embedded chips bridging the nonconductive gaps. The chips may be placed over the top layer of the poly sheet before or after the poly sheet is heated to a malleable condition.

Yet another example of the preferred embodiments includes a method for making an in-mold circuit. The method includes positioning a circuit on a first side of a poly sheet and a wire on a second side of the poly sheet opposite the first side, placing the circuit, poly sheet and wire between thermal platens, heating the poly sheet to a malleable condition, embedding the circuit into the first side of the heated poly sheet and the wire into the second side of the heated poly sheet, and creating conductive communication between the embedded circuit and the embedded wire to form the in-mold circuit.

BRIEF DESCRIPTION OF SEVERAL VIEWS OF THE DRAWINGS

The invention will be described in conjunction with the following drawings in which like reference numerals designate like elements, and wherein:

FIG. 1 is a side sectional view of an in-mold circuit and chip attachment manufacturing device in accordance with the preferred embodiments of the invention;

FIG. 2 is a top view of the in-mold circuit and chip attach approach in accordance with the preferred embodiments;

FIG. 3 is a side sectional view illustrating an exemplary approach for creating a nonconductive gap;

FIG. 4 is a side sectional view illustrating another exemplary approach for creating a nonconductive gap;

FIG. 5 is a side sectional view of a portion of the exemplary approach of FIG. 4 at a different time;

DETAILED DESCRIPTION OF THE PREFERED EMBODIMENTS

Figure 6:
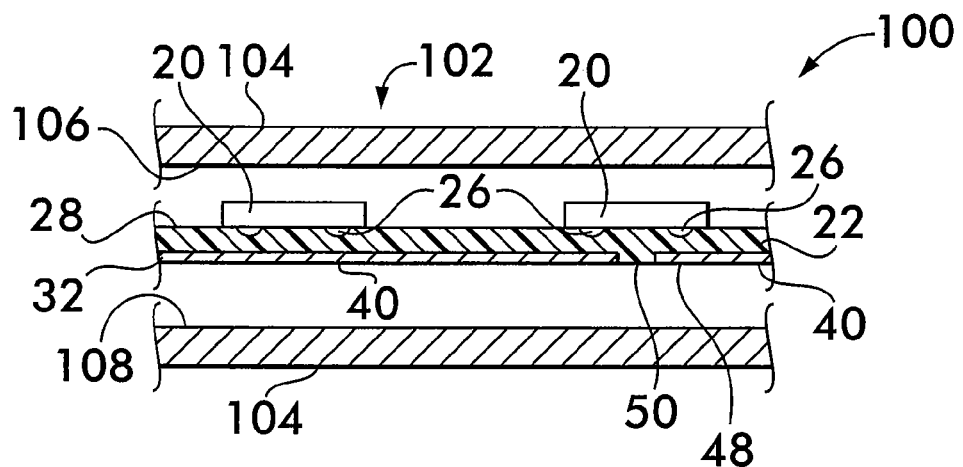
FIG. 6 is a side sectional view of an exemplary in-mold circuit and chip attachment approach in accordance with another embodiment of the invention.

An exemplary embodiment for an in-mold chip strap and approach for making an in-mold strip is shown in FIGS. 1 and 2. As can best be seen in the side sectional view of FIG. 1, a manufacturing device 10 for making an embedded chip strap includes a heater 12 and a rotary station 14 having two rollers 16 and 18 that embeds chips 20 into a layer of poly (e.g., polymer, polyester, polyurethane, polystyrene, PVC), also referred to as a poly sheet 22, moving continuously in a machine direction 24. The poly sheet 22 includes a first layer or side (e.g., top side 28) and a second layer or side (e.g., bottom side 32) opposite the first layer or side. In this embodiment, the chips 20 are placed onto the poly sheet 22 before the poly sheet is heated by the heater 12 to just below its glass thermal temperature. However, the scope of the invention is not limited to this order, as the poly sheet 22 could also be heated to just below its glass thermal temperature before or while the chips 20 are placed onto the poly sheet.

While not being limited to a particular theory, the preferred chips 20 are typically known in the industry as flip chips and include conductive contact points (e.g., conductive bumps 26) that are adapted to conductively communicate with an antenna structure as will be set forth in greater detail below. As can best be seen in FIG. 1, the chips 20 are placed onto the poly sheet 22 preferably before the poly is heated by the heater 12. As such, the chips 20 may move or slid around the poly sheet 22 before the poly is heated, which also restricts the chips' lateral movement. In order to help keep the placed chips 20 from sliding around the poly sheet 22 before reaching the heater, the chips 20 can otherwise be adhered to the poly sheet. For example, the top side 28 of the poly can be preheated before chip placement to hold the chips, or an adhesive, varnish or ink can be added between the chips 20 and the top side 28 for tackiness to hold the chips as would readily be understood by a skilled artisan.

After the chips 20 are placed on the top side 28 of the poly sheet 22, the poly sheet is heated by the heater 12 to just below its glass thermal temperature. While not being limited to a particular theory, the preferred heater 12 includes an oven 30 that causes the temperature of the poly sheet 22 to increase to just below its glass thermal (GT) temperature, for example, by applying heat, radiation or other energy to the poly sheet. The glass thermal temperature of the poly sheet is understood as the temperature at which the poly sheet melts. In the preferred embodiments of the invention, the poly sheet 22 is not actually melted, but is heated to a temperature close to but less than its GT temperature that places the poly sheet in a malleable condition to absorb the chips 20 intended to be pushed into, that is embedded into the poly sheet, yet allows the poly sheet to otherwise maintain its structural integrity, that is, not fall apart. In the exemplary embodiment shown in FIG. 1, the oven 30 heats the poly sheet 22 to a malleable condition whereupon the chips 20 may be gently embedded into the poly sheet without harm to the chips.

As can best be seen in FIG. 1, the chips 20 are placed on top of the poly sheet 22 and remain thereon while advancing through the oven 30. The placed chips 20 and poly sheet 22 move continuously in the machine direction 24 through the rotary station 14, which includes the roller 16 adjacent the top side 28 of the poly sheet, and a roller 18 adjacent the bottom side 32 of the poly sheet. In FIG. 1, the roller 16 rotates counterclockwise, and the second roller 18 rotates clockwise so that the surface of the rollers in contact with the poly sheet 22 roll with the poly sheet in the machine direction 24. In this arrangement, the rollers 16 and 18 may help to advance the poly sheet 22 in the machine direction, although the invention is not limited thereto.

The rollers 16 and 18 are preferably made of a composition (e.g., rubber, plastic) that is resistant to deformation at the heated temperature of the poly sheet 22 and chips 20. That is, the rollers 16, 18 are temperature resistant and maintain their shapes and functionality when exposed to the heated temperatures of the poly sheet and chips. Preferably, the roller 16 is formed of a soft rubber composition that allows the roller to push the chips 20 into the poly sheet 22 without damaging the chips. The roller 18 provides support to the poly sheet 22 as the chips 20 are embedded into the poly sheet. Accordingly, the oven 30 and rollers 16, 18 provide in-mold chips embedded into and protected by the poly sheet 22.

Still referring to FIG. 1, the embedded chips 20 are then conductively coupled to an antenna structure to form transponders, for example, EAS and RFID tags. FIG. 1 shows a preferred approach to coupling the embedded chips to an antenna structure with a chip attach station 34 that embeds one or more lines of wire 40 through the second side 32 of the poly sheet 22 and into conductive communication with the conductive bumps 26. The chip attach station 34 includes rollers 36 and 38 that continuously move the poly sheet 20 along the machine direction 24 and places a wire 40 into conductive communication with the chips 20, as set forth in greater detail below. The chip attach station 34 also includes a heater 42 (e.g., oven) that heats the wire 40 (e.g., conductive strip, rod, coil) to a temperature that softens the poly sheet 22 upon contact and allows the roller 38 to embed the wire into the malleable poly sheet 22 by pushing the wire into the poly sheet. It is understood that this heater 42 is not required if the poly sheet 22 is still in its malleable condition from being heated by the oven 30. If the poly sheet 22 is still in its malleable condition, then heating of the wire 40 may not be required as the roller 38 may embed the wire 40 into the poly sheet 22 as long as the poly sheet is deformable to accept the wire. The embodiment shown in FIG. 1 includes the heater 42 which heats the wire 40 for embedding the wire 40 as also described in detail in U.S. patent application Ser. No. 11/551,995, entitled WIRE EMBEDDED BRIDGE; which has the same inventorship as the invention described in the present application and is incorporated herein by reference in its entirety.

Still referring to FIG. 1, the chip attach station 34 also includes an alignment unit 44 that aligns the wire 40 in a predetermined position to help control its lateral or transverse placement in the poly sheet 22. While not being limited to a particular theory, the chip attach station 34 of the manufacturing device 10 also includes a splitting station 46 that longitudinally separates the wire 40 along the machine direction into wire strips 48 with nonconductive gaps 50 between consecutive wire strips, as will be described by example in greater detail below. The nonconductive gaps 50 are formed between the conductive bumps 26 of the chips 20 and allow the conductive wire 40 to be used as an antenna for the respective chip 20 that bridges the nonconductive gap to form a chip strap or tag. At some point thereafter, the wire strips 48 are cut, for example by a cutter 52 to separate the chip straps or tags for subsequent use.

In operation, the poly sheet 22 moves in the machine direction 24 through the manufacturing device 10. The oven 30 heats the poly sheet 22 to a malleable condition where it can be deformed by an external force, but does not otherwise lose its structural integrity. The roller 16 embeds chips 20 into the top side 28 of the poly sheet 22, and the roller 38 embeds wire 40 into the bottom side 32 for conductive communication with the chips. The rollers 36, 38 are preferably formed of a hard rubber or metal capable of gripping the poly sheet to continuously advance the sheet. The roller 38 is preferably made of a material or composition that is hard enough to push the wire 40 into the poly sheet 22 and is temperature resistant so as to not deform or otherwise be adversely effected by the temperature of the heated poly sheet, embedded chips 20 and/or wire. Therefore, like the rollers 16 and 18, the shapes of the rollers 36, 38 are not compromised by the temperature of the chips 20, the poly sheet 22, and the wire 40 in touch with the rollers, including temperatures high enough to melt or soften the poly sheet and allow its deformation to accept the chips and the wire. The poly sheet 22 becomes a protective carrier for the chips 20 and the wire 40, preventing unwanted damage to the embedded products.

The alignment unit 44 and heater 42 (if needed) prepare the wire 40 for accurate and consistent placement in the poly sheet 22, preferably against the conductive bumps 26 of the chips. In this example, the heating station 42 heats the wire 40 as readily understood by a skilled artisan, for example by applying heat, radiation or other energy to the wire and causing the temperature of the wire to increase to a temperature sufficient to melt or soften the poly sheet 22 in contact with the wire and allow the poly sheet to deform and accept the wire as the wire is pushed into the poly sheet by the roller 38. The alignment unit 44 includes grooves or openings that allow the wire 40 to pass through so that the wire is aligned as desired to be embedded into the poly sheet at a precise location. Preferably, the aligned location of the wire is set to correspond with the conductive bumps 26 of the embedded chips. The alignment unit 44 is preferably location adjacent the roller 38 as needed to prevent the wire 40 from wandering off of its aligned position before being embedded into the poly sheet 22. It is understood that the alignment unit 44 is not limited to a stand alone unit, as it may be attached to or a part of the heater 42 or a part of the roller 38, as long as the alignment unit provides for the alignment of the wire that is embedded into the poly sheet.

Still referring to FIG. 1, the wire 40 is shown as originating as a wound spool of conductive strip that unwinds to dispose the wire toward the poly sheet 22. It is understood that the manner of origin of the wire is not critical to the invention, as the spool of wire is simply an example of where the wire originates. Accordingly, the wire 40 may arrive at the heating station 42 or alignment unit 44 from other sources, as would readily be understood by a skilled artisan.

As is well known in the art, a chip or circuit having multiple conductive contact points attached to a unitary conductor may become shorted if there is no conductive gap between the contact points of the chip. Accordingly, after the wire 40 is embedded into the poly sheet 22, the wire is separated into wire strips 48. In particular, a splitting station 46 cuts the embedded wire 40 between the conductive bumps 26 of the embedded chips 20 as the embedded wire and chips continuously move with the poly sheet 22 in the machine direction 24. In cutting the wire, the splitting station creates nonconductive gaps 50 that inhibit conductive communication between the respective separated wire strips 48, which allow the strips to be used as an antenna for the chips.

FIG. 2 is a partial top view of the manufacturing device 10 in accordance with the preferred embodiments. While not being limited to a particular theory, the exemplary embodiment shown in FIG. 2 illustrates how the manufacturing device can simultaneously embed and attach a multiple number of chips. For example, chips aligned in rows (e.g., three chips per row) are simultaneously placed onto the poly sheet 22 as the sheet moves continuously in the machine direction 24. The poly sheet 22, here with the placed chips, is heated to just below its glass thermal temperature by the oven 30, and the chips 20 are embedded into the poly sheet by the roller 16, as described above. The roller 38 embeds a plurality of lines (e.g., six) of the conductive wire 40 into the second side 32 of the poly sheet 22 and into conductive communication with the embedded chips 20. The lines of embedded wire 40 are shown as dashed lines in FIG. 2 since they are embedded into the second surface 32 of the poly sheet 22 opposite the top side 28 that is directly viewable via the top view. The splitting station 48 creates the gaps 50 in the embedded wire 40 with the gaps nonconductive, as discussed above. By forming the gaps 50, the splitting station 46 also defines the wire strips 48 remaining in the poly sheet 22 and extending to the conductive bumps 26 of the respective embedded chips 20. To help secure the wire strips 48 to the embedded chips 20, the strips may be bonded to the conductive bumps 26, preferably via compression and heat as is well known in the art, to form a mechanical bond therebetween.

While not being limited to a particular theory, the exemplary embodiment shown in FIG. 2 illustrates a plurality of chips (e.g., three) placed side-by-side on the poly sheet and simultaneously moving from place to place. In other words, the chips 20 in each row move together through the oven 30, are simultaneously embedded into the poly sheet 22 by the roller 16, are attached to the lines of coil 40, etc. The lines of wire 40 (e.g., six as shown in FIG. 2 with two lines per longitudinal column of chips) are spaced apart by the alignment unit 44 and simultaneously embedded substantially in parallel by the roller 38 into the poly sheet 22 as the poly sheet moves continuously in the machine direction 24. As can be seen in FIGS. 1 and 2, after the lines of wire 40 are embedded by the roller 38, the lines of wire are cut by the splitting station 46, which forms the nonconductive gaps 50 between consecutive wire strips 48 in each line. The lines of wire are also aligned with the conductive bumps 26 of the chips 20 by the alignment unit 44 for conductive communication with the chips via the conductive bumps that are attached to the wire strips.

It should be noted that the size of the chips 20 and the number of conductive bumps 26 of the chips are not critical to the invention, and are merely shown as an example of a preferred embodiment. It is understood that the lines of wire 40 are embedded to allow the wire to align with the conductive bumps 26 with gaps 50 formed as desired by the splitting station 46. For example, a chip 20 having two conductive bumps 26 could be attached to consecutive wire strips 48 from a single line of wire 40. Moreover, a chip 20 having four conductive bumps 26 may preferably be attached to adjacent wire strips 40 separated and originating from two lines of wire 40, as shown by example in FIG. 2. In other words, the number of lines of wire embedded into the poly sheet 22 corresponds with the number and configuration of conductive bumps 26 of the chips 20 intended to be attached to the wire, as would readily be understood by a skilled artisan.

As noted above, the splitting station 46 cuts through the embedded wire 40 to form the conductive gaps 50. The wire 40 must be removed completely at the gap 50 to avoid the risk that the wire will subsequently short out the chip. There are several ways to create the gap 50. One preferred approach is with a laser that literally vaporizes the unwanted metal. Lasers are preferred because laser cutters can make a precise cut without mechanically touching the web (e.g., poly sheet 22 and embedded wire 40). Laser cutters are well known in the art for ablating wire. The splitting station 46 may also form a nonconductive gap 50 in the wire 40 using a known approach called "kiss cut" achieved with one or more cutting blades.

Other approaches for forming a conductive gap in the wire 40 are discussed below with reference by example to FIGS. 3 and 4. However, it should be noted that whether by laser, kiss cut, the approaches discussed below or an equivalent approach, the splitting station 46 of the preferred embodiments can make this cut without ever slowing the poly sheet 22 down. That is, the poly sheet 22 is continuously moving during chip placement, dipole attachment, and gap formation, for example, at flexographic printing speeds. Moreover, the cut is made within the tolerance allowed by small transponders, including RFID chips, having a size of, for example, about 100 microns or less. The tolerance allowed to create a gap between contact points of such transponder (e.g., conductive bumps 26 of the chips 20) is less than about 80 microns, and more preferably, less than about 20 to 30 microns.

Yet another approach for cutting the embedded wire 40 is illustrated in FIG. 3. As shown in FIG. 3, the splitting station 46 includes a roller 60 having a blade 62 extending outward from the perimeter of the roller to a sharp edge 64. The blade 62 is adapted to rotate with the roller 60 and engage with and cut through the embedded wire 40 as the wire moves with the poly sheet 18 continuously along the machine direction 24. Preferably, the blade 62 extends from the perimeter of the roller 60 to a length that allows the blade to cut through the wire 40, but not to the chip 20 embedded opposite the wire so that the chip is not damaged. In operation, the blade 62 cuts through the wire 40 and into contact with the poly of the poly sheet between the embedded wire and the chip 20, but the blade does not cut and preferably does not touch the chip. The splitting station 46 in FIG. 3 also includes a roller 66 located on the top side 28 of the poly sheet 22 opposite the roller 60 and provides a support or backing for the poly sheet as the blade 62 cuts the wire 40 to form the nonconductive gaps 50. Accordingly, the roller 60 aided by the roller 66 cuts the embedded wire 40 into the wire strips 48.

Yet another preferred example of the splitting station 46 is shown in FIG. 4. In this approach, the splitting station 46 includes a cutter 70 located adjacent the bottom side 32 of the poly sheet 22. The cutter 70 includes a blade or cutting member adapted to cut the wire 40 extending below the bottom side 32 of the poly sheet 22 as described in greater detail below. FIG. 4 also illustrates the roller 16 shown in FIG. 1, and a roller 18A. The roller 18A is an alternative rolling member to the roller 18 shown in FIG. 1 and is somewhat similar to the roller 18 in its purpose and material. For example, the roller 18A includes a curved portion 72 that embeds the wire 40, as described above for roller 18. However, the roller 18A also includes a flat portion 74 that does not extend radially to the periphery of the curved portion 72 of the roller 18A. In operation, as the roller 18A spins or rotates in the direction of the rotational arrow 76, the curved portion 72 embeds the wire 40 into the malleable poly sheet 22 by pushing the wire 40 into the poly sheet. However, the flat section 74 does not push the wire into the poly sheet. Instead, as can best be seen in FIG. 5, the wire 40 remains below the poly sheet 22 while the flat section 74 of the roller 18A faces the poly sheet. The wire 40 that is not embedded remains below the poly sheet 22 as an exposed wire section 78. As the roller 18A continues its rotation, the curved portion 72 again embeds the wire 40 by pushing it into the malleable poly sheet. This periodic embedding of the wire 40 continues as the roller 18A rotates with the poly sheet 22 continuously moving along the machine direction 24.

Referring to FIG. 4, the cutter 70 cuts the exposed wire sections 78 below the bottom side 32 of the poly sheet 22 as the poly sheet advances in the machine direction 24 to create the nonconductive gaps 50 and the embedded wire strips 48. Alternatively, the exposed wire can be etched away after alternately embedding the wire to protect embedded wire.

Figure 7:
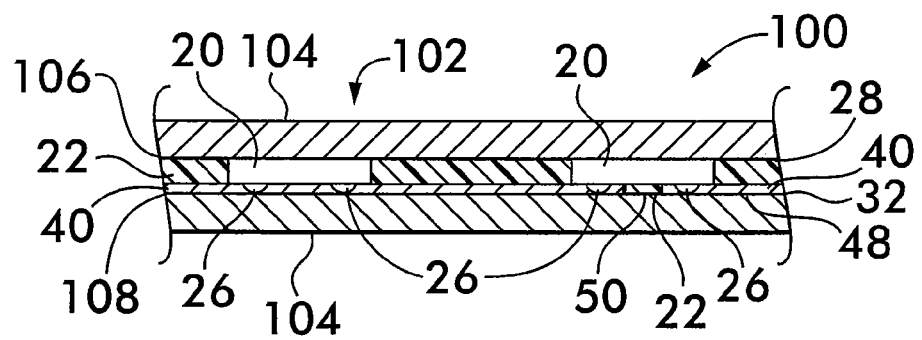
FIG. 7 is a side sectional view of the exemplary approach of FIG. 6.
Figure 8:
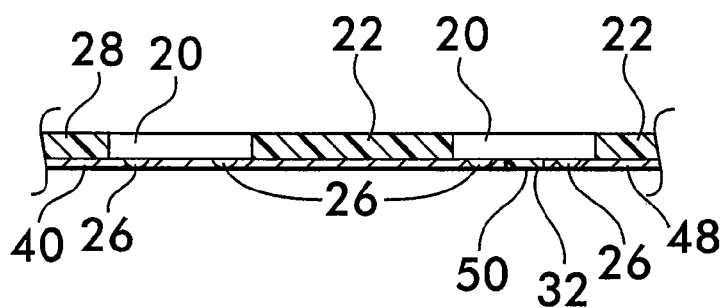
FIG. 8 shows an exemplary result of the exemplary approach of FIGS. 6 and 7.

FIGS. 6-8 depict yet another embodiment of the invention. While not being limited to a particular theory, the embodiment includes an approach for providing encapsulated or embedded chip straps similar to the most preferred embodiments discussed above. In particular, the embodiment exemplified in FIGS. 6-8 shows a method for providing in-mold chip straps that is not as automated as the methods of the most preferred embodiments.

As can best be seen in the side sectional view of FIG. 6, a manufacturing device 100 for making an embedded chip strap includes a heater 102 having thermal platens 104 that heat the temperature of the poly sheet 22' to a temperature just below its glass thermal (GT) temperature, for example by applying heat, radiation or other energy to the poly sheet. The poly sheet 22' may be a roll of polymeric or plastic film (e.g., polymer, polyester, polyurethane, polystyrene, PVC) as discussed above, or a sheet of the same, as the dimensions of the poly sheet are not critical to the embodiment. Preferably the poly sheet 22' is sized to at least partially embed the chips 20 and wire 40 and provide structural integrity to the resulting embedded chip strap.

The thermal platens 104 form an iron-like press on opposite sides of the poly sheet 22' and preferably include a non-stick surface (e.g., Teflon) 106, 108 at respective interior edges adjacent the poly sheet. In order to make the embedded chip straps, for example, the thermal platens 104 are arranged to apply heat and pressure to the chips, wire 40 and poly sheet 22', with the heat making the poly sheet malleable, and the pressure pushing the chips 20 and wire into the poly sheet. As can best be seen in FIG. 6 (before pressing) and FIG. 7 (after pressing), the thermal platens heat the poly sheet 22', the thermal platen 104 with the non-stick surface 106 presses the chips 20 into the top side 28 of the malleable poly sheet, and the thermal platen 104 with the non-stick surface 108 presses the wire 40 (or wire strips 48) into the bottom side 32 of the malleable poly sheet. Preferably the conductive bumps 26 of the chips 20 are aligned with the wire 40, 48 so that the thermal platens 104 press the conductive bumps into contact with the wire and thereby provide conductive communication between the chips and the wire.

FIG. 8 depicts the resulting poly sheet 22' embedding the chips 20 and wire 40 into conductive communication after removal from the manufacturing device 100. While not being limited to a particular theory, the removal of the embedded chips 20, wire 40 and poly sheet 22' is benefited from the non-stick surfaces 106, 108, as any sticking of the poly sheet to the thermal platens 104 is mitigated by the non-stick surfaces. The wire 40 between the conductive bumps 26 may be precut to form nonconductive gaps before the embedding step described above or after the embedding step. Preferably the nonconductive gaps 50 are formed prior to the embedding of the chips 20 and wire 48, as shown in the right-sided portion of FIG. 8, as it is safer to cut the wire without concern for damaging an attached chip. The chip strap shown in the left-sided portion of FIG. 8 still requires a gap in the wire between the conductive gaps of the attached chip to prevent shorting of the chip. Of course, the nonconductive gaps 50 could be provided by the splitting station 46 in a manner as discussed above, or as known to a skilled artisan.

While not being limited to a particular theory, the preferred embodiments of the invention provide an in-mold circuit embedded into a poly sheet in a continuous motion. The inventors have discovered that connecting the conductive bumps of chips to independent lines of wire, as shown for example in FIG. 2, minimizes unwanted parasitic capacitance between the chip circuit and its antenna structure, especially over chips attached to single antenna bands. The parasitic capacitance becomes more relevant as the chip is used with higher frequencies (e.g., UHF or higher). When coupling a chip to an antenna structure, any nearby conductive material is relevant as it can create unwanted capacitance, lowering the frequency of the tuning. The circuit made by the manufacturing device and method described herein provides the additional benefit of minimizing parasitic capacitance by minimizing conductive overlap around the bonding sites between the chip and its antenna structure. In fact, the preferred diameter of the wire 40 is less than the diameter of the conductive bumps 26 of the chips 20 to further minimize conductive overlap.

While not being limited to a particular theory, the preferred depth of the poly sheet 22 is about 50-75 microns; the preferred depth of the chips is about 25-60 microns; and the preferred diameter of the wire 40 is about 15-40 microns. However, it is understood that the measurements of the poly sheet, chips and wire are not critical to the invention as other measurements may be used and are considered within the scope of the invention. Preferably, the depth of the poly sheet 22 is greater than the depth of the chips and is about equal to the depth of the chips and the diameter of the wire 40 combined. The wire preferably is not insulated and is formed of a conductive material (e.g., gold, aluminum, copper).

It is understood that the method and apparatus for making in-mold circuits described herein are exemplary indications of preferred embodiments of the invention, and are given by way of illustration only. In other words, the concept of the present invention may be readily applied to a variety of preferred embodiments, including those disclosed herein. While the invention has been described in detail and with reference to specific examples thereof, it will be apparent to one skilled in the art that various changes and modifications can be made therein without departing from the spirit and scope thereof. For example, the poly sheet 2 may be heated with the chips placed on top, or the poly sheet may be heated before the chips are placed. Moreover, the scope of the invention is not limited to the illustrated spatial orientations, and the inventive apparatus works for its intended purpose even if oriented upside down or in some other relationship to the orientation of the apparatus disclosed by example herein. It is also important to note that the products described above can be reheated and molded to other plastics. Without further elaboration, the foregoing will so fully illustrate the invention that others may, by applying current or future knowledge, readily adapt the same for use under various conditions of service.

What is claimed is:

1. A manufacturing device for making an in-mold circuit, comprising:
   a heater that heats a poly sheet continuously moving along a machine direction to a malleable condition; and
   a pressing station adjacent said heating station, said pressing station embedding integrated circuits placed onto the poly sheet into the heated poly sheet as the embedded integrated circuits and poly sheet continuously move in the machine direction, the integrated circuits having a surface including conductive areas and nonconductive areas.

2. The manufacturing device of claim 1, further comprising a strip applicator adjacent said pressing station, said strip applicator embedding a conductive strip into the poly sheet adjacent the surface of the integrated circuit and into conductive communication with the conductive areas of the surface of the integrated circuits as the conductive strip and poly sheet continuously move along the machine direction to form an embedded conductive strip.

3. The manufacturing device of claim 2, further comprising a heating station adjacent said strip applicator, said heating station heating the conductive strip to be embedded into the poly sheet.

4. The manufacturing device of claim 2, further comprising an alignment unit having spacers that align the conductive strip with the conductive areas of the surface of the embedded integrated circuit.

5. The manufacturing device of claim 2, wherein said strip applicator includes a splitting station separating the conductive strip into portions of the conductive strip, said splitting station forming nonconductive gaps between consecutive portions of the conductive strip with respective consecutive portions conductively coupled with respective embedded integrated circuits such that said respective embedded integrated circuit bridges the respective nonconductive gap between the respective consecutive portions of the conductive strip.

6. The manufacturing device of claim 5, wherein said splitting station includes a laser that periodically ablates the embedded conductive strip adjacent the nonconductive areas of the surface of the integrated circuits embedded in the poly sheet to form the nonconductive gaps.

7. The manufacturing device of claim 5, wherein said splitting station includes a blade that mechanically cuts the embedded conductive strip adjacent the nonconductive areas of the surface of the integrated circuits embedded in the poly sheet to form the nonconductive gaps.

8. The manufacturing device of claim 5, wherein said splitting station includes a cutting station cutting the embedded conductive strip between consecutive integrated circuits embedded in the poly sheet continuously moving along the machine direction.

9. The manufacturing device of claim 8, wherein said cutting station includes a rotary station continuously moving the embedded conductive strip along the machine direction, said rotary station including a blade that cuts the conductive strip.

10. The manufacturing device of claim 2, wherein said strip applicator includes a first roller adjacent a first side of the continuously moving poly sheet and a second roller adjacent a second side of the continuously moving poly sheet opposite the first side that pushes the conductive strip into the poly sheet to embed the conductive strip.

11. The manufacturing device of claim 2, wherein said strip applicator includes a first roller adjacent a first side of the continuously moving poly sheet and a second roller adjacent a second side of the continuously moving poly sheet opposite the first side that periodically pushes the conductive strip into the poly sheet to periodically embed the conductive strip, and a cutter that cuts the conductive strip not embedded in the poly sheet.

12. The manufacturing device of claim 2, wherein the embedded conductive strip includes a pair of conductive wires embedded in said poly sheet substantially in parallel along the machine direction adjacent the surface of the integrated circuit and into conductive communication with the conductive areas of the surface of the integrated circuits to minimize parasitic capacitance between the integrated circuit and the conductive strip by minimizing conductive overlap around the conductive areas between the integrated circuit and the conductive wires.

13. The manufacturing device of claim 1, wherein said pressing station includes a first roller adjacent a first side of the continuously moving poly sheet and a second roller adjacent a second side of the continuously moving poly sheet opposite the first side, said first roller formed of a rubber or poly material having a hardness sufficient to press the integrated circuits into the heated poly sheet without causing damage to the integrated circuits.

14. A manufacturing device for making an in-mold circuit, comprising:
   means for continuously moving a poly sheet along a machine direction;
   means for heating the continuously moving poly sheet to a malleable condition; and
   means for embedding integrated circuits placed onto the poly sheet into the heated poly sheet as the embedded integrated circuits and poly sheet continuously move in the machine direction, the integrated circuits having a surface including conductive areas and nonconductive areas.

15. The manufacturing device of claim 14, further comprising means for embedding a conductive strip into the poly sheet and into conductive communication with the embedded integrated circuits as the conductive strip and poly sheet continuously move to form an embedded conductive strip.

16. The manufacturing device of claim 15 further comprising means for separating the embedded conductive strip along the machine direction into portions of the conductive strip, and forming nonconductive gaps between consecutive portions of the conductive strip, the consecutive portions conductively coupled with a respective embedded integrated circuit bridging the nonconductive gap.

17. The manufacturing device of claim 16, wherein the means for separating the embedded conductive strip along the machine direction includes means for periodically embedding the conductive strip into the poly sheet, and means for cutting the periodically embedded conductive strip not embedded in the poly sheet adjacent the embedded integrated circuits to form the nonconductive gaps.

18. The manufacturing device of claim 15, further comprising means for heating the conductive strip before embedding the conductive strip into the poly sheet.

19. The manufacturing device of claim 15, further comprising means for aligning the conductive strip with the conductive areas of the embedded integrated circuits before embedding the conductive strip into the poly sheet.

* * * * *

UNITED STATES PATENT AND TRADEMARK OFFICE
CERTIFICATE OF CORRECTION

PATENT NO. : 7,621,043 B2
APPLICATION NO. : 11/554237
DATED : November 24, 2009
INVENTOR(S) : Cote et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 93 days.

Signed and Sealed this

Twenty-sixth Day of October, 2010

David J. Kappos
*Director of the United States Patent and Trademark Office*